(12) United States Patent
Pinnow et al.

(10) Patent No.: US 8,062,694 B2
(45) Date of Patent: Nov. 22, 2011

(54) METHOD FOR PRODUCING MEMORY HAVING A SOLID ELECTROLYTE MATERIAL REGION

(75) Inventors: Cay-Uwe Pinnow, Munich (DE); Klaus-Dieter Ufert, Unterschleissheim (DE)

(73) Assignee: Adesto Technology Corporation, Sunnyvale, CA (US)

( * ) Notice: Subject to any disclaimer, the term of this patent is extended or adjusted under 35 U.S.C. 154(b) by 0 days.

(21) Appl. No.: 12/913,565

(22) Filed: Oct. 27, 2010

(65) Prior Publication Data
US 2011/0037014 A1    Feb. 17, 2011

Related U.S. Application Data

(63) Continuation of application No. 11/153,964, filed on Jun. 16, 2005, now Pat. No. 7,829,134.

(30) Foreign Application Priority Data

Jun. 18, 2004  (DE) .................. 10 2004 029 436

(51) Int. Cl.
*C30B 29/10*  (2006.01)

(52) U.S. Cl. .................. 427/58; 427/123; 427/125

(58) Field of Classification Search .................. 427/58, 427/123, 125
See application file for complete search history.

(56) References Cited

U.S. PATENT DOCUMENTS

| | | | |
|---|---|---|---|
| 3,898,096 A * | 8/1975 | Heredy et al. ............... | 429/103 |
| 4,009,052 A | 2/1977 | Whittingham | |
| 4,040,917 A | 8/1977 | Whittingham | |
| 4,323,480 A * | 4/1982 | Dines et al. .................. | 502/215 |
| 6,878,618 B2 * | 4/2005 | Lowrey et al. ............... | 438/625 |
| 6,998,697 B2 * | 2/2006 | Campbell et al. ............ | 257/529 |
| 7,151,273 B2 * | 12/2006 | Campbell et al. ............ | 257/3 |
| 7,247,357 B2 | 7/2007 | Shiba et al. | |
| 7,319,057 B2 * | 1/2008 | Lowrey ........................ | 438/200 |
| 7,829,134 B2 * | 11/2010 | Pinnow et al. ............... | 427/58 |
| 7,833,825 B2 * | 11/2010 | Mitzi et al. .................. | 438/95 |
| 7,928,419 B2 * | 4/2011 | Gopalakrishnan et al. .. | 257/2 |
| 2002/0038883 A1 * | 4/2002 | Lowrey et al. ............... | 257/314 |
| 2002/0190350 A1 * | 12/2002 | Kozicki et al. .............. | 257/532 |
| 2003/0003300 A1 * | 1/2003 | Korgel et al. ................ | 428/402 |
| 2003/0064293 A1 * | 4/2003 | Elliott et al. ................. | 430/1 |
| 2003/0068861 A1 | 4/2003 | Li et al. | |
| 2003/0137869 A1 * | 7/2003 | Kozicki ........................ | 365/158 |

(Continued)

FOREIGN PATENT DOCUMENTS

DE      10051049     4/2002

OTHER PUBLICATIONS

"Holographic Investigations of Photoinduced Changes in PECVD Ge-Se Thin Films", V. Boev, et al., Vacuum 27 (1996) 1211-1213.

(Continued)

*Primary Examiner* — Bob M Kunemund

(74) *Attorney, Agent, or Firm* — Dicke, Billig & Czaja, PLLC

(57) ABSTRACT

A method for producing a solid electrolyte material region for a memory element of a solid electrolyte memory cell. A first material is formed in substantially pure form. A thermal treatment is carried out in the presence of at least one second material, and the chalcogenide material of the solid electrolyte material region thereby being produced.

20 Claims, 8 Drawing Sheets

U.S. PATENT DOCUMENTS

| | | | |
|---|---|---|---|
| 2003/0155589 A1* | 8/2003 | Campbell et al. | 257/225 |
| 2003/0209971 A1* | 11/2003 | Kozicki | 313/498 |
| 2004/0042259 A1* | 3/2004 | Campbell et al. | 365/158 |
| 2004/0124406 A1* | 7/2004 | Campbell et al. | 257/4 |
| 2004/0258866 A1* | 12/2004 | Shiba et al. | 428/35.7 |
| 2006/0001000 A1* | 1/2006 | Pinnow et al. | 252/62.2 |
| 2006/0221555 A1* | 10/2006 | Pinnow | 361/525 |
| 2008/0084653 A1* | 4/2008 | Pinnow | 361/525 |
| 2008/0209876 A1* | 9/2008 | Miller | 55/522 |
| 2008/0304312 A1* | 12/2008 | Ho et al. | 365/148 |
| 2008/0314738 A1* | 12/2008 | Gopalakrishnan et al. | 204/247.4 |
| 2009/0073743 A1* | 3/2009 | Kasko et al. | 365/149 |
| 2011/0037014 A1* | 2/2011 | Pinnow et al. | 252/62.2 |

OTHER PUBLICATIONS

"On the Optical Constants of Amorphous $Ge_xSe_{1-x}$ Thin Films of Non-Uniform Thickness Prepared by Plasma-Enhanced Chemical Vapour Deposition", Vacuum 52 (1999) 55-60.

"Optical Properties of Quasi-Simultaneous Sputtered $Ge_xSe_{1-x}$", Journal of Non-Crystalline Solids, (1991) vol. 130, No. 1, p. 52-57.

"Sputtering of Chalcogenide Coatings on to Fluoride Glass", Physics of Non-Crystalline Solids Taylor & Francis: London, UK, (1992), p. 193-197.

"Silver Doping of Chalcogenide Thin Films for Optical Waveguide Fabrication", J. Fick, et al., CLEO (2001) p. 15.

* cited by examiner

METHOD FOR PRODUCING MEMORY HAVING A SOLID ELECTROLYTE MATERIAL REGION

CROSS-REFERENCE TO RELATED APPLICATIONS

This Utility Patent Application is a continuation application of U.S. application Ser. No. 11/153,964, filed Jun. 16, 2005 and claims priority to German Patent Application No. DE 10 2004 029 436.4, filed on Jun. 18, 2004, which is incorporated herein by reference.

FIELD OF THE INVENTION

The present invention relates to a method for producing a solid electrolyte material region and, in particular, to a method for producing a solid electrolyte material region for a memory element of a solid electrolyte memory cell.

BACKGROUND

In the production of solid electrolyte memory cells, sputtering processes are used for forming the solid electrolyte material region that is to be provided as the memory. What is disadvantageous about these methods, however, is the inadequate reproducibility of the layer properties and also, in particular, the lack of layer homogeneity. Moreover, sputtering methods of this type exhibit difficulties with regard to satisfying ever more rigorous dimensioning requirements with regard to a maximum scale of integration to be achieved for corresponding memory elements and memory devices. Even the use of so-called CVD processes can only provide a remedy to a limited extent in this case because processes of this type are based on material combinations which are comparatively temperature-sensitive and can therefore lead to difficulties during the subsequent further processing processes.

For these and other reasons, there is a need for the present invention.

SUMMARY

A method for producing a solid electrolyte material region for a memory element of a solid electrolyte memory cell. A first material is formed in substantially pure form. A thermal treatment is carried out in the presence of at least one second material, and the chalcogenide material of the solid electrolyte material region thereby being produced.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1A:
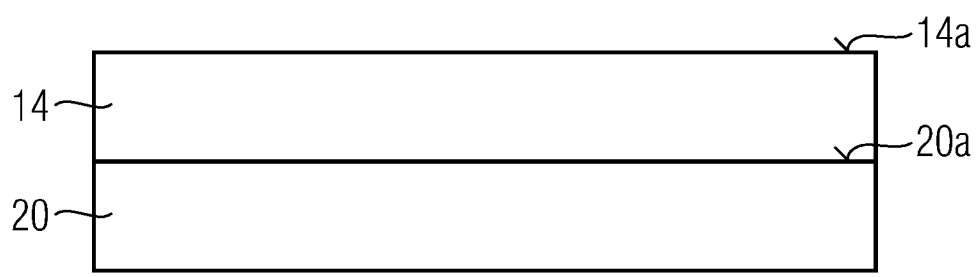
FIGS. 1A-E are schematic and sectional side views of intermediate stages that are reached in one preferred embodiment of the method according to the invention for producing a solid electrolyte material region in a memory.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a method for producing a solid electrolyte material region which can produce thin structures extended with small dimensioning in a particularly simple yet nevertheless reliable manner.

In one embodiment of a method according to the invention for producing a solid electrolyte material region for a memory element of a solid electrolyte memory cell, a solid electrolyte material region is formed from or with a chalcogenide material. In this embodiment, at least one first material region is formed from at least one first material on which the chalcogenide material is based, in a substantially pure form. A thermal treatment process is then carried out on the resulting structure or on the structure obtained, to be precise in the presence of at least one second material on which the chalcogenide material is based. The chalcogenide material of the solid electrolyte material region is produced in this case.

Consequently, a basic idea of the present invention is to produce the constituent required for the solid electrolyte material region from chalcogenide material by providing an underlying first material and then carrying out a thermal treatment step on the first material in the presence of a second underlying material, and thereby overall to carry out a conversion to form the required chalcogenide material of the solid electrolyte material region.

In one embodiment of a method according to the invention for producing a solid electrolyte material region, it is provided that the at least one second material on which the chalcogenide material is based or a part thereof is provided as a further material region or in a further material region.

As an alternative embodiment, it may be provided that the at least one second material on which the chalcogenide material is based or a part thereof is provided as a process atmosphere or in a process atmosphere.

The two possibilities of providing the at least one second material on which the chalcogenide material is based may also be combined with one another or be effected alternately with one another.

In accordance with a further additional or alternative embodiment of the method according to the invention, it is provided that the at least one second material on which the chalcogenide material is based or a part thereof is provided as a liquid or in a liquid.

In accordance with a further measure, it is provided that, as an alternative or in addition the thermal treatment or a part thereof is initiated thermally and/or carried out thermally. However, other possibilities of initiating and/or carrying out the thermal treatment are also conceivable.

By way of example, it may be provided that the thermal treatment or a part thereof is initiated and/or carried out thermally in the context of an irradiation using a laser or a laser beam, in particular in a local or localized manner.

In another alternative or additional embodiment of a method according to the invention for producing a solid electrolyte material region, it is provided that the thermal treatment step or a part thereof is carried out in the context of a furnace process and/or in the context of an RTA process.

In a further advantageous refinement of a method according to the invention for producing a solid electrolyte material region, it is provided that a plurality of layers of the at least one first and of the at least one second material on which the chalcogenide material is based are deposited progressively and/or alternately, and that the thermal treatment step is then effected, that is to say that the thermal treatment is carried out in particular on a stack of a sequence of the first and second materials for the chalcogenide material region.

In accordance with another embodiment of a method according to the invention, it may be provided that the at least one first material on which the chalcogenide material is based is or has a material from the group formed by germanium Ge, silicon Si, tungsten W and arbitrary mixtures or compounds thereof.

Furthermore, it may be provided as an alternative or in addition that the at least one second material on which the chalcogenide material is based on or has $Se_2S_2O$.

These and further aspects of the present invention are also explained in more detail on the basis of the elucidations below.

In one embodiment, the invention relates in particular inter alia to a method for producing thin GeSe and GeS chalcogenide layers by means of thermal methods.

The present notification of invention describes a method for producing thin chalcogenide layers, such as e.g. made of $Ge_xSe_{1-x}$ and $Ge_xS_{1-x}$, which may be used as solid electrolyte materials in semiconductor memory elements. By way of example, Si—Se or Si—S are also conceivable.

Hitherto, various sputtering processes have been proposed as processes for depositing GeSe and GeS layers. However, these processes have the inherent disadvantage of not being suitable for bulk production for small lateral dimensions, in particular less than 100 nm, since the reproducibility and layer homogeneity of the processes are not good enough. See, for example, Journal of Non-Crystalline Solids (1991) vol. 130, no. 1, p. 52-7.21 refs. CODEN: JNCSBJ ISSN 0022-3093 Journal paper Broese, E.; Schroter, B.; Lehmann, A.; Richter, W.; Schirmer, G.; "Optical properties of quasi-simultaneous sputtered $Ge_xSe_{1-x}$", Physics of Non-Crystalline Solids Taylor & Francis: London, UK, 1992. p. 193-7, xvi+761 pp., 7 refs. Conference: Cambridge, UK, 4-9 Aug. 1991 ISBN 0-7484-0050-8 Conference paper (English) Moore, M. W.; France, P. W.; Davey, S. T.; ed. Pye, L. D.; La Course, W. C.; Stevens, H. J. "Sputtering of chalcogenide coatings on to fluoride glass". Added to this is the fact that the sputtering process is not suitable for filling very small contact holes since holes in the material, so-called "voids", material "seams", form on the undersides of the sidewalls, and reduce the functionality of the layers (to function as solid electrolyte material) or even render it totally unusable since the material properties at these weak points deviate significantly from those of the rest of the layer.

In order to produce thin $Ge_xSe_{1-x}$ layers, only a PECVD deposition by using germanium ($GeH_4$) has been disclosed hitherto besides the sputtering methods mentioned. See, for example, E. Marquez et al., "On the optical constants of amorphous $Ge_xSe_{1-x}$ thin films of non-uniform thickness prepared by plasma-enhanced chemical vapour deposition", Vacuum 52 (1999) 55-60, V. Boev et al., "Holographic investigations of photoinduced changes in PECVD Ge—Se thin films", Vacuum 47 (1996) 1211-1213. Through plasma CVD (PECVD), however, structural damage to the layer is to be expected as a result of the high energy of individual particles in the plasma.

One disadvantage of the CVD processes that use $GeH_4$ as germanium carrier gas is the fact that the $GeH_4$ is not suitable for thermal CVD of $Ge_xSe_{1-x}$ and $Ge_xS_{1-x}$ layers since the decomposition temperature of $GeH_4$ is very high. Combined Ge and Se CVD processes tends to be difficult to establish since they have to proceed at low temperatures in order to produce amorphous Ge—Se and/or Ge—S layers.

In the context of this invention, the electrolyte layer $Ge_xSe_{1-x}$ or $Ge_xS_{1-x}$ of the memory cell is formed in a two-stage process. This has the advantage that critical processes can be separated (deposition and thermal annealing). Since only pure (one-component) materials are deposited during the deposition, the advantage of increased purity and simplified process implementation and process control is afforded. Moreover, this process has the advantage that the GeSe or GeS layer can be formed in a self-aligned manner with respect to the contact hole.

In the case of a PMC cell, one targeted approach is to fill a contact hole with a chalcogenide material (e.g., by means of a CVD process). With CVD it is possible to fill narrow contact holes with unfavorable (high) aspect ratios. The CVD method proposed makes it possible to reproducibly produce extremely thin layers with sufficient edge coverage, so that the layers can be filled conformally even into narrow contact hole openings, which is necessary in the context of scaling of the lateral geometrical dimension. Further advantages of layers deposited by means of CVD are their layer homogeneity, density and purity. However, this notification of invention is not limited to layer deposition by means of CVD, rather it is likewise possible to use other deposition methods to deposit the initial layer(s).

By using a method that has not yet been utilised hitherto to successively deposit pure germanium and selenium (or sulfur) and to subsequently subject these individual layers and/or multilayers to heat treatment in a suitable atmosphere (possibly containing sulfur or selenium), it is possible to produce germanium selenide (Ge—Se) and germanium sulphide (Ge—S). A further possibility that is mentioned in this notification of invention is to expose a pure germanium layer to a suitable atmosphere containing selenium (or sulfur) in order thus to implement the Ge—Se or Ge—S layer growth process. Corresponding structures or processes with or comprising Si, Si—Se or Si—S are also conceivable.

Embodiment A) (FIGS. 1A to 1E)

Germanium is deposited (e.g. by means of CVD, ALD, sputtering, spin-on, spray-coating, PLD, or the like) and subjected to thermal aftertreatment (by means of a furnace process or RTA process) in a selenium-containing (or sulfur-containing) atmosphere, so that a Ge—Se layer or a Ge—S layer forms, depending on the duration and the temperature chosen, as a result of a selenium or sulfur diffusion into the geranium layer. Corresponding structures with or comprising Si, Si—Se or Si—S are also conceivable.

The following formation specifications are conceivable:

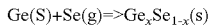

or

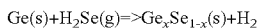

or

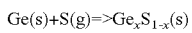

or

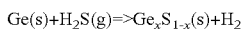

In this embodiment, the sulfur S or the selenium Se may have been supplied both in elementary gas form (e.g., decomposed in an RF plasma) and in molecular gas form in combined carrier gases, i.e., $H_2Se$ or $H_2S$. In general, an increase in the layer thickness is to be assumed as a result of the thermal aftertreatment; in this case, the layer thickness will increase proportionally to the quantity of incorporated sulfur (or selenium). Silicon Si may also be used here in each case instead of germanium Ge.

Embodiment B) (FIGS. 1A to 1E)

A germanium layer and a selenium layer (or sulfur layer) are deposited successively. A thermal aftertreatment by means of a furnace process or RTA method then takes place, by means of which an intermixing of the Ge and Se layers takes place. The overall stoichiometry can be adapted with deposition of the correct layer thicknesses of the respective element. Embodiments with Si instead of Ge and/or with S instead of Se are also conceivable.

Embodiment C) (FIGS. 3A to 3F)

A multilayer stack of a plurality of layers (alternately germanium and selenium layers) (that is to say Ge/Se/Ge/Se/ . . . or Ge/S/Ge/S/ . . . ), are deposited successively. The individual layers can subsequently react thermally with one another e.g. in an inert gas atmosphere or at atmosphere containing selenium (or sulfur). The stoichiometry of the final layer is achieved by adapting the thickness of the individual layers.

It is possible to demonstrate that a competitor has employed the invention since, in case of dispute, the process sequence used is apparent upon inspection. The fact that for example a CVD method has been used to deposit the GE layer can be demonstrated by way of the edge coverage in a contact hole and/or by way of residual gas contaminants in the layer.

Structurally similar, comparable or equivalent elements are designated by the same reference symbols below. A detailed description is not repeated on every occasion that they occur.

The sequence of FIGS. 1A-1E describes a first embodiment of the method according to the invention for producing a solid electrolyte material region 16, to be precise on the basis of schematic and sectional side views of intermediate stages that are reached when performing the method.

In FIG. 1A, firstly a basic material or substrate 20 having a surface region 20a and on that a first or bottom electrode 14 having a surface region 14a are formed and/or provided.

Figure 1B:
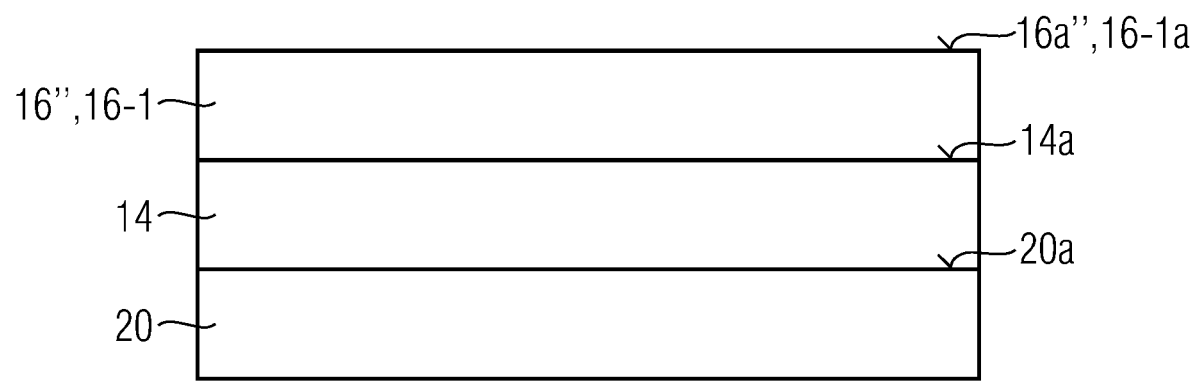

In the transition to the intermediate state illustrated in FIG. 1B, a first material region 16" made of a first material 16-1 is then formed on the surface region 14a of the first or bottom electrode 14, said first material 16-1 being fundamental for the chalcogenide layer to be formed or for the material region to be formed made from a chalcogenide material or comprising a chalcogenide material. A free surface 16a", 16-1a arises in this case.

Figure 1C:
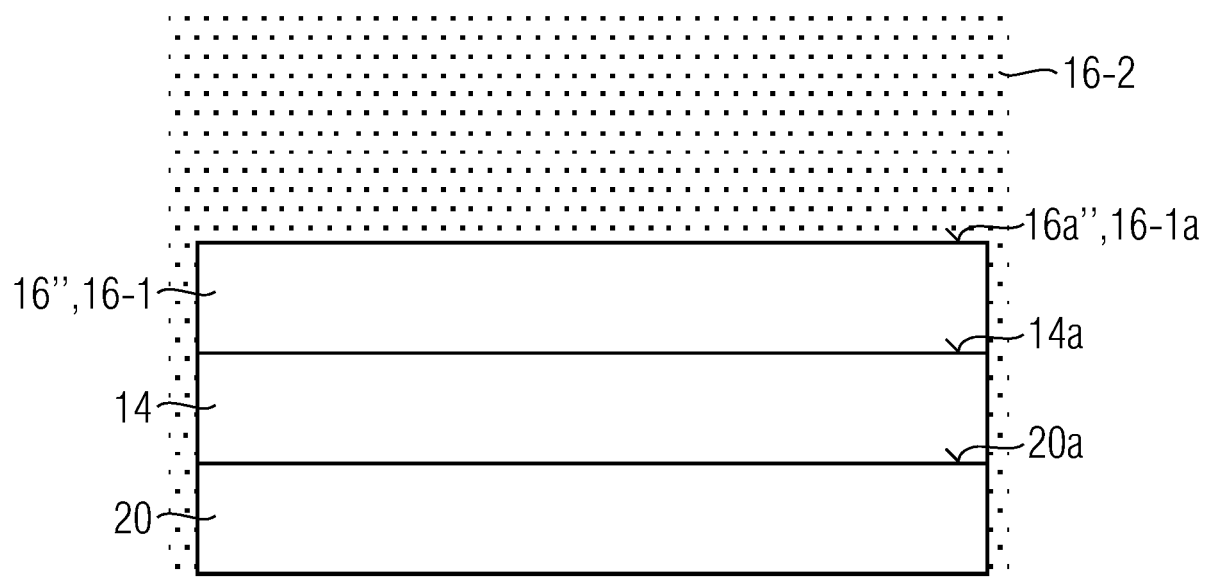

In the transition to the intermediate state illustrated in FIG. 1C, the structure from FIG. 1B is then exposed to a process gas atmosphere 30, which, as a constituent, has a second material 16-2 or comprises the latter, the second material 16-2 likewise being fundamental for the chalcogenide material to be formed. The first material 16-1 may for example be germanium and/or silicon, which is provided in solid form, whereas the second fundamental material 16-2 is then provided either as a compound or in elementary form in gaseous fashion, e.g., as selenium in gaseous form.

Figure 1D:
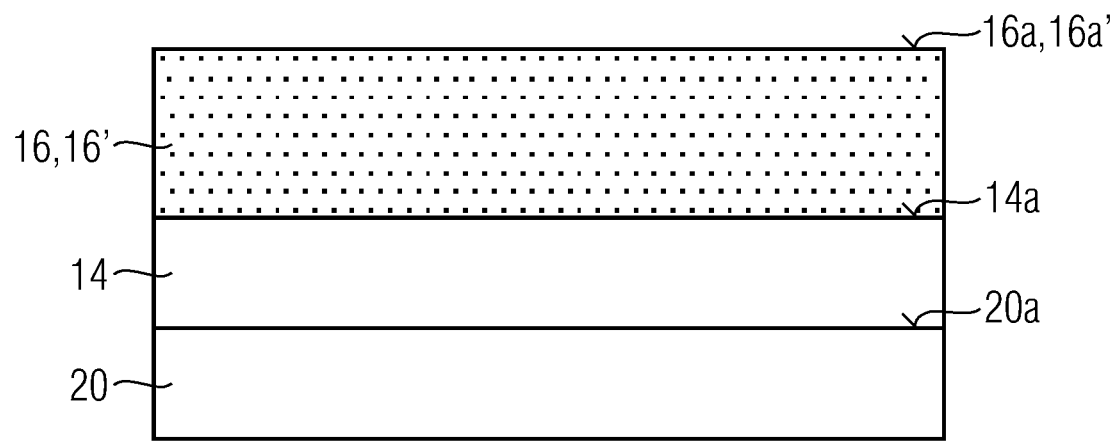

In the transition to the intermediate state illustrated in FIG. 1D, the formation of the material region 16 or solid electrolyte material region 16 then takes place, which is formed by the solid electrolyte material 16', which, for its part, arises from a conversion of the first material 16-1 for the chalcogenide material 16 in the presence of the second material 16-2 for the chalcogenide material 16', to be precise in the context of a thermal treatment. As has been described above, the thermal treatment may be thermally initiated and/or conducted; however, it may also be initiated and/or conducted on the basis of other sources of energy, e.g., on the basis of other types of electromagnetic radiation, on the basis of particle radiation, etc. The completion of the solid electrolyte material region 16 made of the solid electrolyte material 16' or chalcogenide material 16' then gives rise to the structure with a free surface region 16a, 16a' illustrated in FIG. 1D.

Figure 1E:
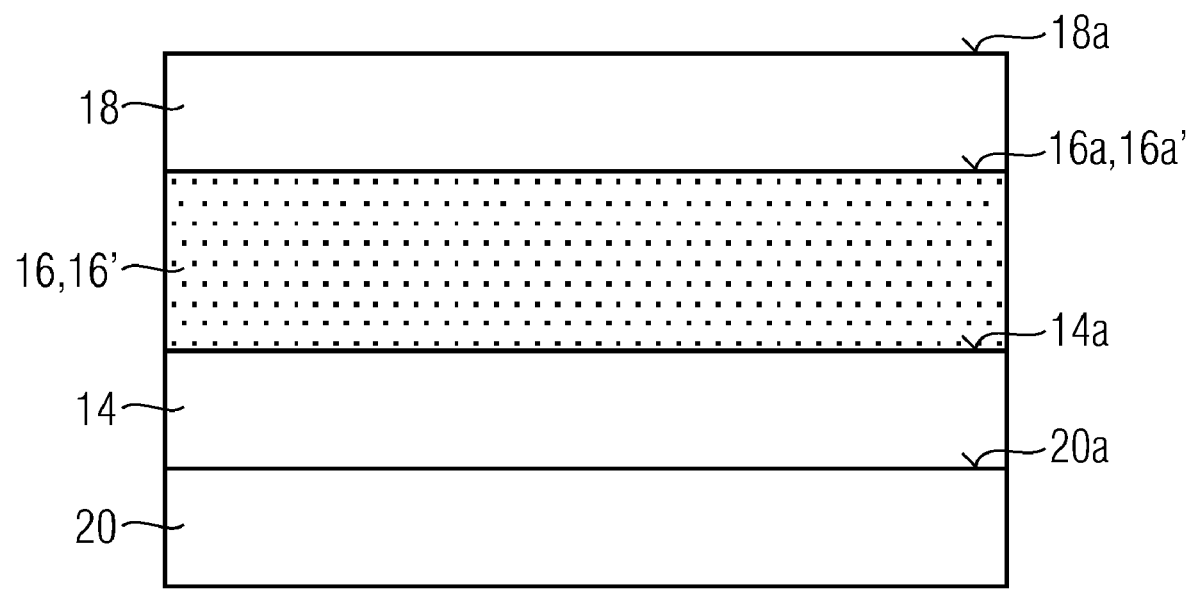

In the transition to the intermediate state illustrated in FIG. 1E, a second or top electrode 18 having a surface region 18a is then formed on the free surface 16a, 16a' of the structure illustrated in FIG. 1D. In this way, a corresponding memory element 10 then results for the solid electrolyte memory cell 1.

The embodiment of the production method according to the invention for a solid electrolyte material region 16 in accordance with FIGS. 1A to 1E thus consists in providing a first fundamental material 16-1 in a solid-like manner on a surface region 14a of the bottom electrode 14 and then offering the second fundamental material 16-2 in a gaseous manner as process gas atmosphere or as part of the process gas atmosphere in the context of the thermal treatment step.

The sequence of FIGS. 2A to 2E likewise show, in schematic and sectional side view, intermediate stages that are reached in another embodiment of the method according to the invention for producing a solid electrolyte material region. In this case, FIGS. 2A and 2B essentially correspond to FIGS. 1A and 1B.

Figure 2A:
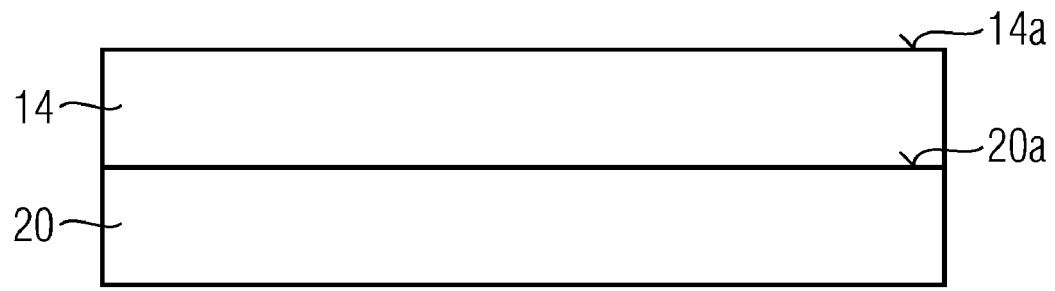
FIGS. 2A-E are schematic and sectional side views of intermediate stages that are reached in one preferred embodiment of a method according to the invention for producing a solid electrolyte material region in a memory.

FIG. 2A illustrates the initial structure on which this embodiment is based and which, moreover, essentially corresponds to the initial structure illustrated in FIG. 1A. In FIG. 2A, a basic material or substrate 20 having a surface region 20a and on that a bottom electrode 14 having a surface region 14a are formed and/or provided.

Figure 2B:
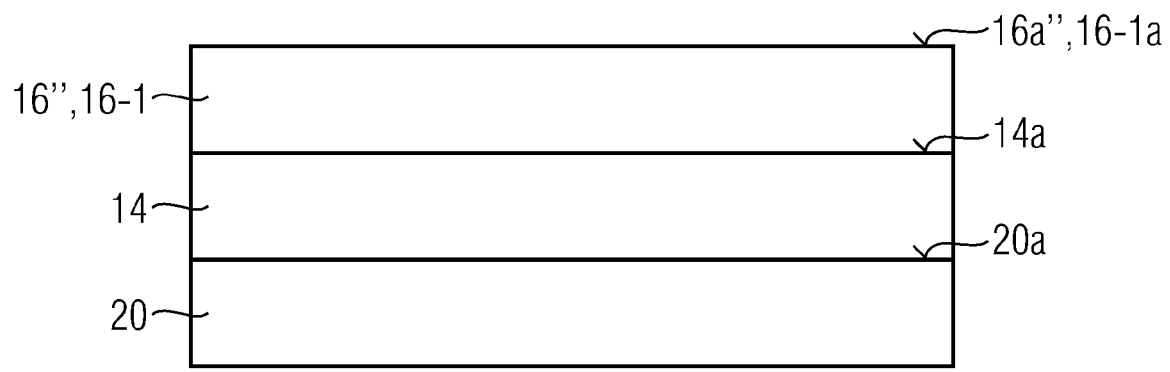

In the transition to the intermediate state illustrated in FIG. 2B, a material region 16" made of a first material 16-1 is then formed on the surface region 14a of the first or bottom electrode 14, said first material 16-1 being fundamental for the chalcogenide layer to be formed or for the material region to be formed made from a chalcogenide material or comprising a chalcogenide material. A free surface 16a'', 16-1a arises in this case.

Figure 2C:
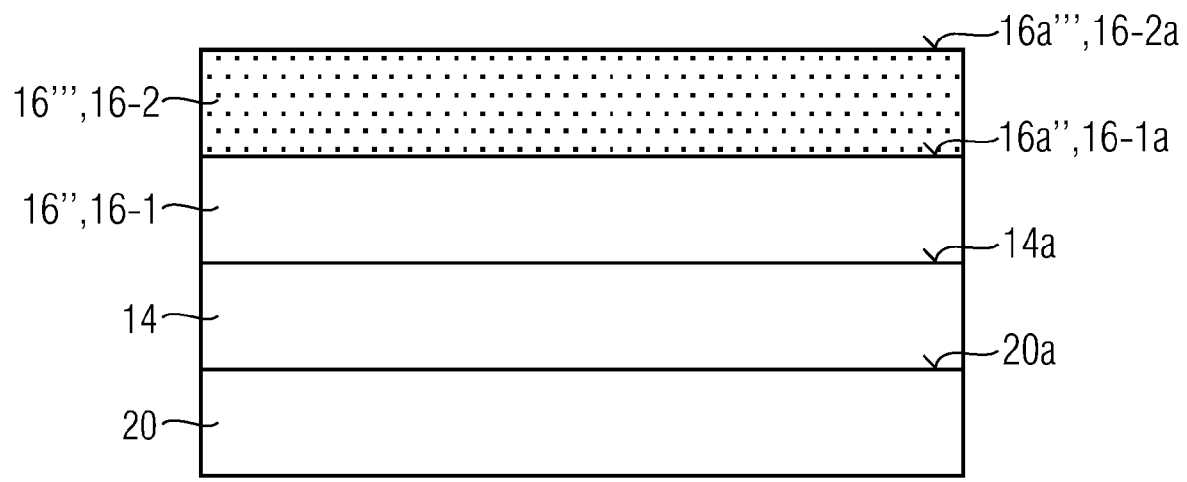

In the transition to the intermediate state illustrated in FIG. 2C, a second material region 16''' made of a second material 16-2 that is fundamental to the chalcogenide material, having a free surface 16a''', 16-2a, is then formed on the free surface 16a'', 16-1a of the first material region 16'' that is fundamental for the chalcogenide material and is made of the first fundamental material 16-1. The first fundamental material 16-1 and the second fundamental material 16-2 for the chalcogenide material are thus present in close proximity and in intimate contact with one another in accordance with the structure illustrated in FIG. 2C.

Figure 2D:
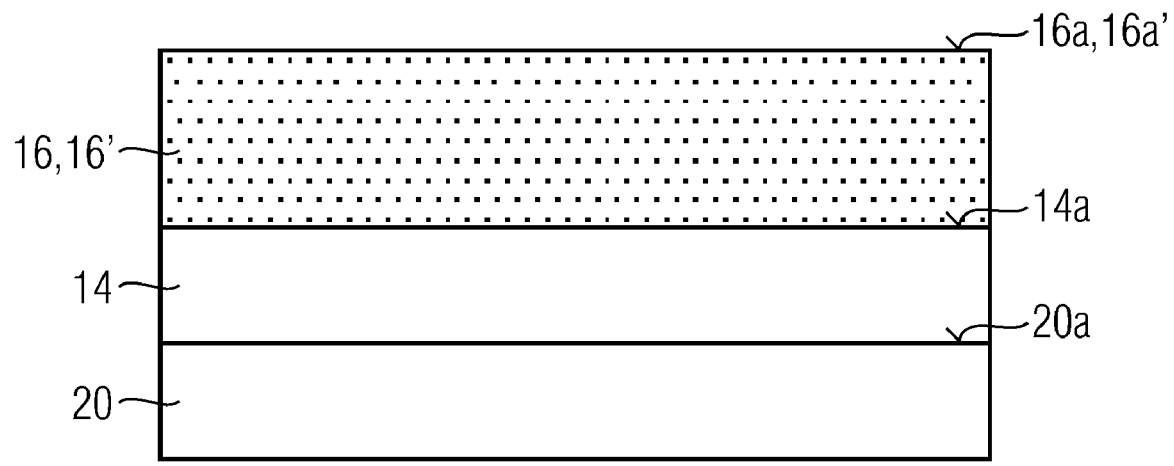

In the transition to the intermediate stage illustrated in FIG. 2D, the thermal treatment step is then performed, the fundamental materials 16-1 and 16-2 provided then being converted to form the solid electrolyte material 16' or chalcogenide material 16' of the solid electrolyte material region 16 having a free surface region 16a, 16a'.

Figure 2E:
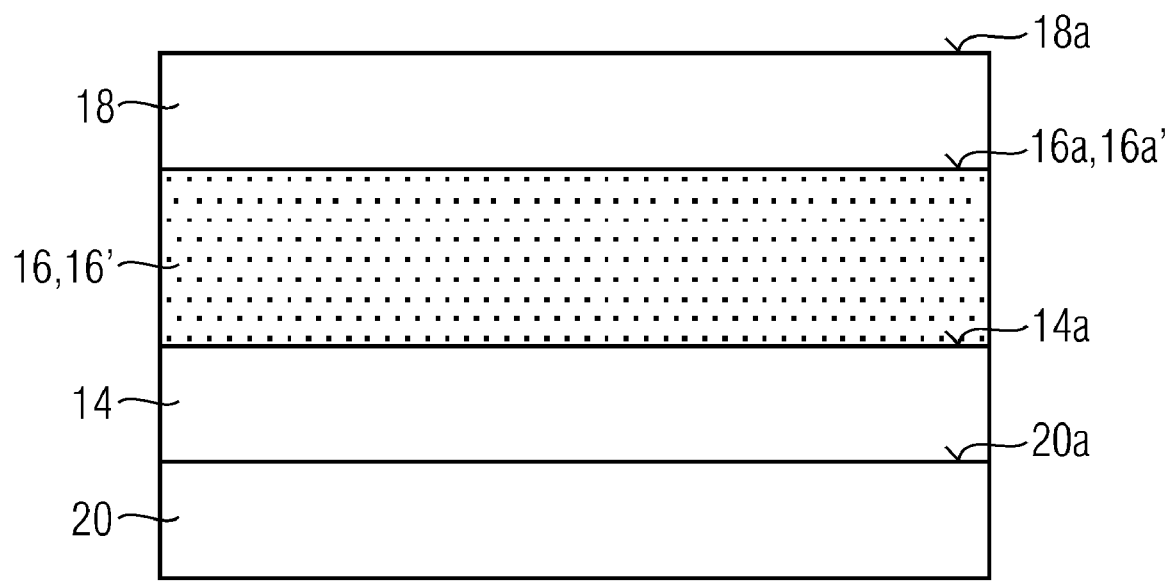

In the transition to the intermediate state illustrated in FIG. 2E, a second or top electrode 18 having a surface region 18a is then formed on the free surface 16a, 16a' of the structure illustrated in FIG. 2D. In this way, a corresponding memory element 10 then results for the solid electrolyte memory cell 1.

The embodiment of the method according to the invention for producing a solid electrolyte material region in accordance with the sequence of FIGS. 2A to 2E is thus based on the fact that the first material 16-1 that is fundamental for the chalcogenide material and the second material 16-2 that is fundamental for the chalcogenide material are formed as individual layers one after the other and in intimate contact with one another on the first or bottom electrode 14 and are thereby ready together in solid-like form during the thermal treatment step for conversion into the solid electrolyte material region 16.

The sequence of FIGS. 3A to 3F illustrates, once again in the form of schematic and sectional side views, intermediate stages of another embodiment of the method according to the invention for producing a solid electrolyte material region.

Figure 3A:
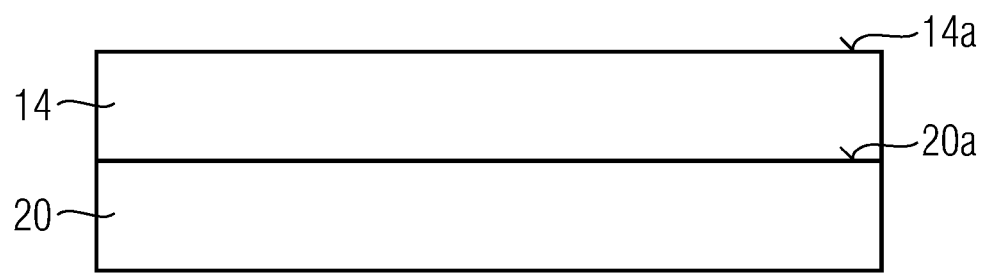
FIGS. 3A-F are schematic and sectional side views of intermediate stages that are reached in one preferred embodiment of a method according to the invention for producing a solid electrolyte material region in a memory.

The starting point for this embodiment of the method according to the invention is the basic structure which is illustrated in FIG. 3A and which essentially corresponds to the basic structure of FIGS. 1A and 2A.

In FIG. 3A, firstly a basic material or substrate 20 having a surface region 20a and on that a first or bottom electrode 14 having a surface region 14a are formed and/or provided.

Figure 3B:
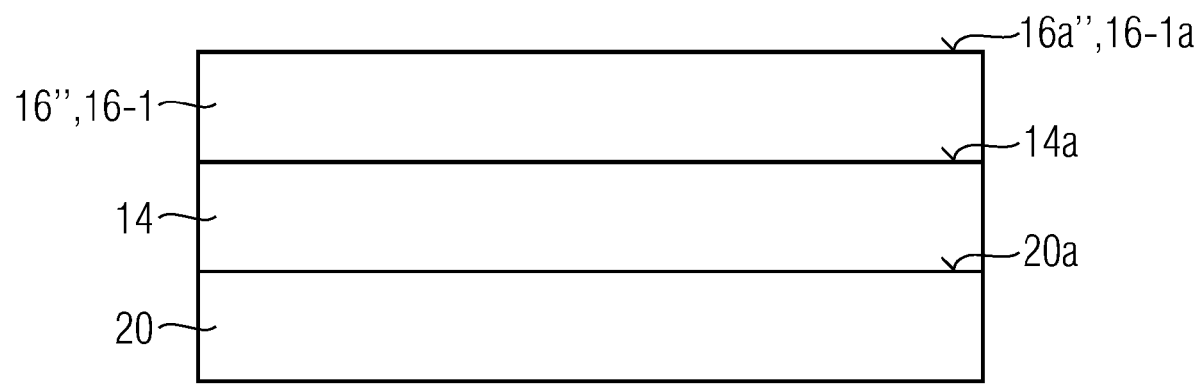

In the transition to the intermediate state illustrated in FIG. 3B, a structure is produced which essentially corresponds to the structure from FIGS. 1B and 2B. In the transition to the intermediate state illustrated in FIG. 3B, a first material region 16'' made of a first material 16-1 is then formed on the surface region 14a of the first or bottom electrode 14, the first material 16-1 being fundamental for the chalcogenide layer to be formed or for the material region to be formed made from a chalcogenide material or comprising a chalcogenide material. A free surface 16a'', 16-1a arises in this case.

Figure 3C:
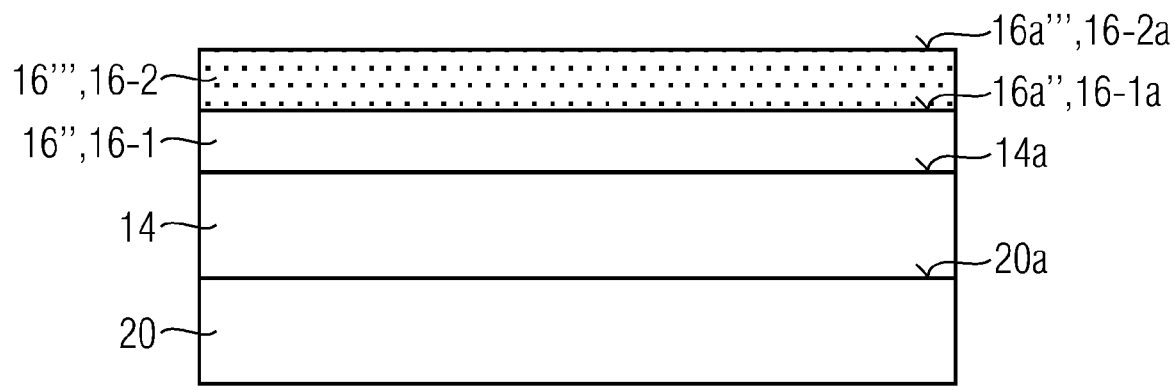

In the transition to the intermediate state illustrated in FIG. 3C, a structure is then produced which essentially corresponds to the structure from FIG. 2C. In the transition to the intermediate state illustrated in FIG. 3C, a second material region 16''' made of a second material 16-2 that is fundamental to the chalcogenide material, having a free surface 16a''', 16-2a, is then formed on the free surface 16a'', 16-1a of the first material region 16'' that is fundamental for the chalcogenide material and is made of the first fundamental material 16-1. The first fundamental material 16-1 and the second fundamental material 16-2 for the chalcogenide material are thus present in close proximity and in intimate contact with one another in accordance with the structure illustrated in FIG. 2C.

Figure 3D:
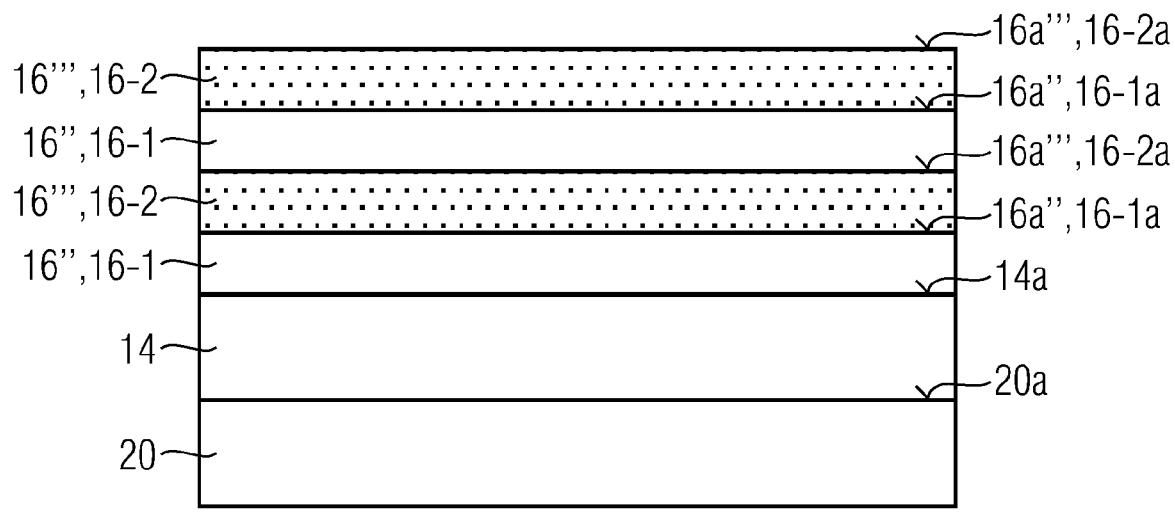

In the transition to the intermediate stage of this embodiment of the production method according to the invention as illustrated in FIG. 3D, the method steps mentioned in connection with FIGS. 3B and 3C are then repeated in the known order, thus giving rise to the structure illustrated in FIG. 3D, in the case of which material regions 16'' and 16''' of the first fundamental material 16-1 and of the second fundamental material 16-2, respectively, alternate alternately, thus giving rise to a sequence of, for example, four layers that is formed on the free surface region 14a of the first or bottom electrode 14 in this order. It goes without saying that it is conceivable, however, to choose a smaller number, e.g., 3, or a larger number, e.g., 5, 6, 7, ..., for this layer sequence. Furthermore, it is also conceivable that not always the same material compositions are chosen for the individual layers, rather there is variation with regard to the fundamental materials or else their concentrations in the individual layers.

Figure 3E:
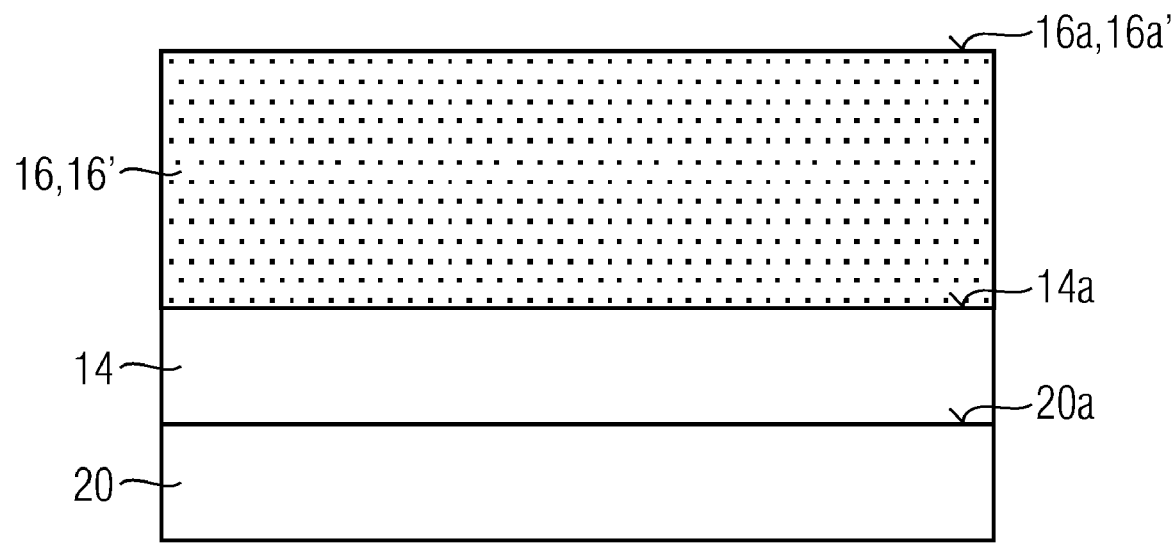

In the transition to the intermediate state illustrated in FIG. 3E, the thermal treatment step is then carried out, by means of which the sequence of the material layers made of the first fundamental material 16-1 and the second fundamental material 16-2 is converted into the solid electrolyte material region 16 comprising the solid electrolyte material 16' or chalcogenide material 16' and having a free surface 16a, 16a'.

Figure 3F:
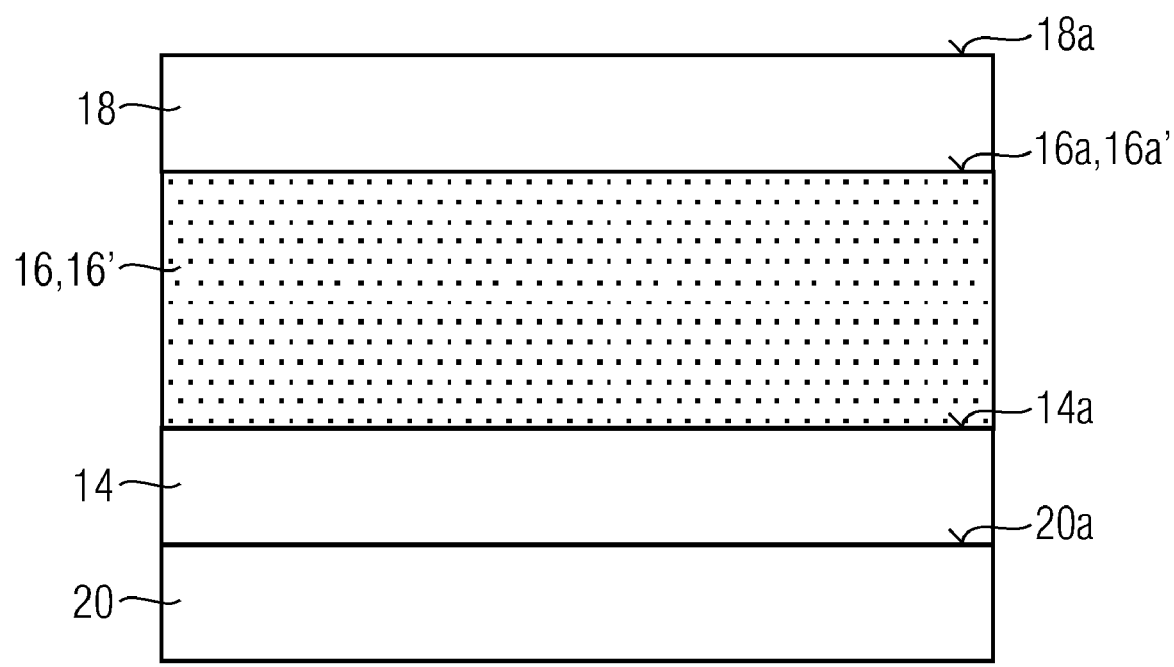

In the transition to the intermediate state illustrated in FIG. 3F, a second or top electrode 18 having a surface region 18a is then formed on the free surface 16a, 16a' of the structure illustrated in FIG. 3D. In this way, a corresponding memory element 10 then results for the solid electrolyte memory cell 1.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a memory including a memory cell, comprising:
   forming a solid electrolyte chalcogenide material comprising at least a first element and a second element by
      forming a first layer comprising the first element and not the second element; and
      applying a thermal treatment to the first layer in a heat treatment environment that includes the second element.

2. The method of claim 1, wherein:
   one of the elements comprises germanium (Ge).

3. The method of claim 2, wherein:
   the other of the elements is selected from the group of: selenium (Se) and sulfur (S).

4. The method of claim 1, wherein:
   the heat treatment environment includes a gas containing the second element.

5. The method of claim 4, wherein:
   the first layer comprises germanium in solid form; and
   the gas is selected from hydrogen selenide ($H_2Se$) and hydrogen sulfide ($H_2S$).

6. The method of claim 1, wherein:
the heat treatment environment includes a plasma that disassociates the second element from a source gas.

7. The method of claim 1, further including:
forming the chalcogenide material between a first electrode and a second electrode.

8. A method for producing a memory including a memory cell, comprising:
forming a solid electrolyte chalcogenide material comprising at least a first element and a second element by
forming at least a first layer comprising the first element and not the second element;
forming at least a second layer comprising the second element in direct contact with the first layer; and
applying a thermal treatment to intermix at least the first material and second material to create the chalcogenide material.

9. The method of claim 8, wherein:
one of the elements comprises germanium (Ge); and
the other of the elements is selected from a group consisting of: selenium (Se) and sulfur (S).

10. The method of claim 8, wherein:
the thermal treatment is selected from a group consisting of: a rapid thermal anneal (RTA), application of a laser, and application of electromagnetic radiation.

11. The method of claim 8, further including:
forming additional layers that alternate between layers comprising the first element and substantially not the second element and layers comprising the second element; and
applying the thermal treatment to intermix such additional layers to create the chalcogenide material.

12. The method of claim 8, wherein:
the thermal treatment is applied in an inert atmosphere that does not include the first or second elements.

13. The method of claim 8, wherein:
the thermal treatment is applied in an atmosphere that includes at least one of the elements.

14. The method of claim 8, further including:
forming the chalcogenide material between a first electrode and a second electrode.

15. A method for producing a memory cell, comprising:
depositing a first layer within a contact hole comprising a first element and not a second element; and
intermixing the first layer with at least the second element to form a solid electrolyte chalcogenide material within the contact hole.

16. The method of claim 15, wherein:
intermixing the first layer with at least the second element includes applying a thermal treatment to the first layer in a heat treatment environment that includes the second element.

17. The method of claim 16, wherein:
the second element is included within a material selected from: a gas and a liquid.

18. The method of claim 15, wherein:
one of the elements is germanium; and
the other of the elements is selected from the group of: selenium and sulfur.

19. The method of claim 15, wherein:
intermixing the first layer with at least the second element includes
depositing a second layer, comprising the second element, in physical contact with the first layer, and
applying a thermal treatment.

20. The method of claim 15, further including:
forming a first electrode;
depositing the first layer includes depositing the first layer in contact with the first electrode; and
forming a second electrode over the chalcogenide material.

* * * * *